United States Patent
Yao et al.

(10) Patent No.: US 8,492,720 B2
(45) Date of Patent: Jul. 23, 2013

(54) SMALL LOW-PROFILE OPTICAL PROXIMITY SENSOR

(75) Inventors: Yufeng Yao, Singapore (SG); Chi Boon Ong, Singapore (SG); Rani Saravanan, Singapore (SG)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 275 days.

(21) Appl. No.: 12/796,528

(22) Filed: Jun. 8, 2010

(65) Prior Publication Data

US 2011/0297831 A1  Dec. 8, 2011

(51) Int. Cl.
*G01J 5/20* (2006.01)

(52) U.S. Cl.
USPC ...................................................... 250/338.4

(58) Field of Classification Search
USPC ...................................................... 250/338.4
See application file for complete search history.

(56) References Cited

U.S. PATENT DOCUMENTS

| | | | |
|---|---|---|---|
| 5,528,075 A * | 6/1996 | Burns | 257/666 |
| 5,565,674 A * | 10/1996 | Reele | 250/239 |
| 6,127,671 A | 10/2000 | Parsons et al. | |
| 6,958,261 B2 | 10/2005 | Chow et al. | |
| 7,309,855 B2 * | 12/2007 | Nagasaka et al. | 250/231.14 |
| 7,385,178 B2 * | 6/2008 | Chin et al. | 250/231.14 |
| 7,485,842 B2 | 2/2009 | Bich et al. | |
| 7,486,386 B1 | 2/2009 | Holcombe et al. | |
| 2006/0016994 A1 | 1/2006 | Basoor et al. | |
| 2006/0086899 A1 | 4/2006 | Chao et al. | |
| 2006/0237540 A1 * | 10/2006 | Saxena et al. | 235/454 |
| 2008/0219673 A1 | 9/2008 | Goh | |
| 2008/0296478 A1 * | 12/2008 | Hernoult | 250/216 |
| 2009/0027652 A1 | 1/2009 | Chang et al. | |
| 2009/0159900 A1 | 6/2009 | Basoor et al. | |
| 2010/0133629 A1 * | 6/2010 | Zhang et al. | 257/414 |
| 2010/0181578 A1 * | 7/2010 | Li et al. | 257/82 |
| 2010/0230599 A1 | 9/2010 | Yamaguchi et al. | |
| 2010/0258712 A1 * | 10/2010 | Wiese et al. | 250/237 R |
| 2011/0001223 A1 * | 1/2011 | Lee | 257/666 |

FOREIGN PATENT DOCUMENTS

JP    11214741    8/1999

OTHER PUBLICATIONS

English Abstract of JP11214741—Patent Application of Masaki, Published Aug. 6, 1999.
"Evolving applications mandate new proximity sensor designs", Web site: www.automation.com/resources-tools/articles-white-papers/sensors-sensing-technologies.
"Surface-Mount Proximity Sensor"; Avago Technologies; Nov. 26, 2009 (13 pages).
Pending Patent Application "Proximity Sensor" of Yao et al. filed Jun. 8, 2010.

* cited by examiner

*Primary Examiner* — Christine Sung (57) ABSTRACT

In an embodiment, the invention provides a proximity sensor including a transmitter die, a receiver die, an ASIC die, a lead frame, wire bonds, a first transparent encapsulant, a second transparent encapsulant, and an opaque encapsulant. The transmitter die, the receiver die and the ASIC die are attached to portions of the lead frame. Wire bonds electrically connect the transmitter die, the receiver die, the ASIC die, and the lead frame. The first transparent encapsulant covers the receiver die, the ASIC die, the wire bonds, and a portion of the lead frame. The second transparent encapsulant covers the transmitter die, the wire bonds, and a portion of the lead frame. The opaque encapsulant covers portions of the first and second encapsulants and a portion of the lead frame.

3 Claims, 6 Drawing Sheets

SMALL LOW-PROFILE OPTICAL PROXIMITY SENSOR

BACKGROUND

A proximity sensor is a sensor that is able to detect the presence of nearby objects without physical contact. A proximity sensor often emits an electromagnetic or electrostatic field, or a beam of electromagnetic radiation (e.g. infrared) and looks for changes in the field or return signal. The object being sensed is often referred to as the proximity sensor's target. Different proximity sensor targets require different sensors. For example, a capacitive or photoelectric sensor might be suitable for a plastic target and an inductive proximity sensor may be suitable for a metal target.

Usually, a proximity sensor includes a transmitter and a receiver. When a target is placed in range of the proximity sensor, the target reflects electromagnetic energy (e.g. light) emitted from the transmitter to the receiver. The receiver then sends a signal that indicates that the target is in range.

Proximity sensors may be used for many purposes. For example, a proximity sensor is often used with a water faucet to automatically turn on the water when a person's hands are near the faucet. In another example, proximity sensors may be used to monitor machine vibration while measuring the variation in distance between a shaft and its support bearing. The use of proximity sensors to monitor vibration is common in large steam turbines, compressor and motors.

As automation equipment becomes smaller, the packaging size of proximity sensors need to be become smaller as well. In addition, the cost of manufacturing a proximity sensor should be lowered in order to be competitive. One method for reducing the cost of manufacturing proximity sensors is to reduce the number of steps needed to manufacture proximity sensors.

DETAILED DESCRIPTION

The drawings and description, in general, disclose a proximity sensor package including a lead frame, a transmitter die, a receiver die and an ASIC (application specific integrated circuit) die. A first encapsulant that is transparent to light covers the receiver die, the ASIC die and a first portion of the lead frame. A second encapsulant that is also transparent to light covers the transmitter die and a second portion of the lead frame. An encapsulant that is opaque to light covers a portion of the first transparent encapsulant, a portion of the second transparent encapsulant and a third portion of the lead frame.

The opaque encapsulant attenuates the transmission of electromagnetic radiation between the transmitter and the receiver. Because the opaque encapsulant attenuates the transmission of electromagnetic radiation between the transmitter and the receiver, cross-talk between the transmitter and the receiver is reduced. The reduction of cross-talk between the transmitter and the receiver will be explained in more detail as follows.

In this Detailed Description, reference is made to the accompanying drawings, which form a part hereof, and in which are illustrated specific embodiments according to which the invention may be practiced. In this regard, directional terminology, such as "top," "bottom," "atop," "beneath," "forward," "backward," "side," "front," "back," etc., is used with reference to the orientation of the Figures being described. Because the components of various embodiments of the invention may be positioned in a number of different orientations, the directional terminology is used for the purpose of illustration and is in no way limiting. It is to be understood that other embodiments may be utilized, and that structural or logical changes may be made without departing from the scope of the present invention. The following Detailed Description, therefore, is not to be taken in a limiting sense, and the scope of the present invention is defined by the appended claims.

Figure 1:
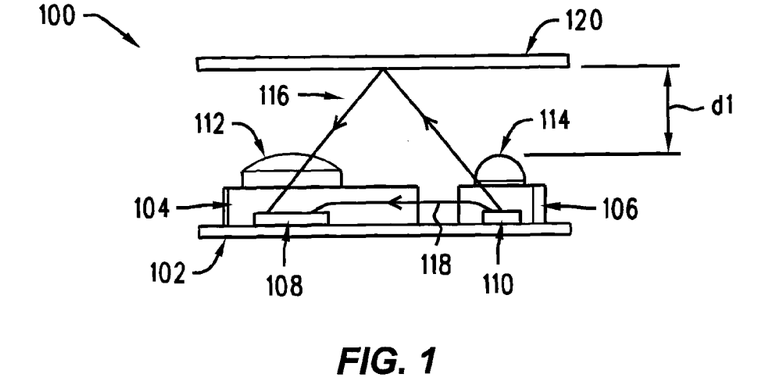
FIG. 1 is a schematic drawing of an embodiment of a proximity sensor package.

FIG. 1 is a schematic drawing of an embodiment of a proximity sensor package 100. In this embodiment, the transmitter is an LED 110 and the receiver is a photodiode 108. The receiver may also be a PIN (P-type semiconductor region, Intrinsic semiconductor region, N-type semiconductor region) diode or a photo transistor for example. The LED 110 and the photodiode 108 are mounted to a substrate 102. A first optical lens 114 and a first transparent encapsulant 106 are formed over the LED 110. A second optical lens 112 and a second transparent encapsulant 104 are formed over the photodiode 108. An object 120 is located above the proximity sensor package 100 for illustrative purposes.

When LED 110 is forward-biased, current is drawn through LED 110. Drawing current through LED 110 in this embodiment causes LED 110 to radiate electromagnetic radiation as illustrated by rays 116 and 118. Ray 116 is radiated through the first transparent encapsulant 106 and through the first optical lens 114. After leaving optical lens 114, ray 116 is reflected by object 120 through optical lens 112 and the second transparent encapsulant 104 into photodiode 108. Ray 118 travels through the first and second transparent encapsulants, 106 and 104 respectively, striking photodiode 108.

The photodiode 108 converts electromagnetic radiation that strikes it into current. This current may be detected. The amount of current detected is proportional to the amount of electromagnetic radiation striking photodiode 108. The amount of current detected may be used to determine a distance d1 between the object 120 and the proximity sensor package 100. Ideally, only electromagnetic radiation from LED 110 that is reflected by the object 120 with background radiation subtracted would be converted to current. However, other electromagnetic radiation, such as ray 118, may be converted into current.

Electromagnetic radiation from LED 110 that strikes photodiode 108 may be considered cross-talk if it is not reflected from the object 120. Cross-talk interferes with the determination of the distance d1 from the object 120 to the proximity sensor package 100. Cross-talk should be minimized in order to allow the proximity sensor package 100 to operate more accurately.

Figure 2:
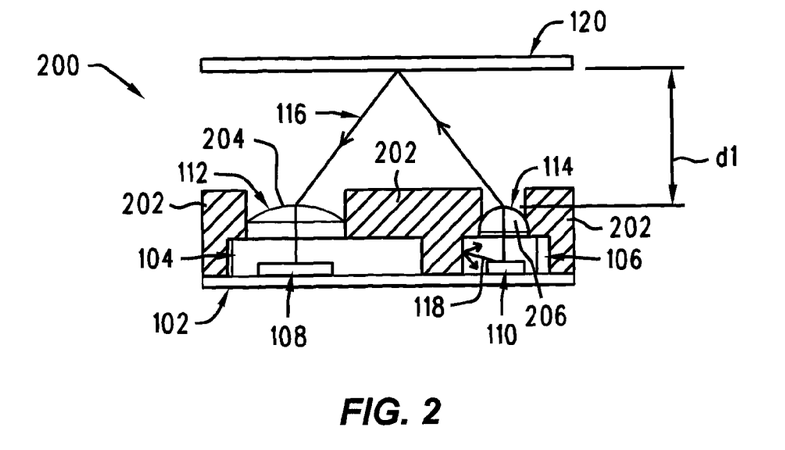
FIG. 2 is a schematic drawing of an embodiment of a proximity sensor package.

FIG. 2 is a schematic drawing of a second embodiment of a proximity sensor package 200. In this second embodiment, an LED 110 and a photodiode 108 are mounted to a substrate 102. A first optical lens 114 and a first transparent encapsulant 106 are formed over LED 110. A second optical lens 116 and a second transparent encapsulant 104 are formed over photodiode 108.

An encapsulant 202 that is opaque to light is formed over the first and second transparent encapsulants 106 and 104 respectively and over portions of the substrate 102. In addition, the opaque encapsulant 202 covers a portion of the first and second optical lenses 114 and 112 respectively. However, in this embodiment, the opaque encapsulant 202 does not cover the entire dome portions 204 and 206 of the optical lenses 112 and 114 respectively. In this second embodiment, the opaque encapsulant 202 attenuates electromagnetic radiation. An object 120 is located above the proximity sensor package 200 for illustrative purposes.

When LED 110 is forward-biased, current is drawn through LED 110. Drawing current through LED 110 in this embodiment causes LED 110 to radiate electromagnetic radiation as illustrated by rays 116 and 118. Ray 116 is radiated through the first transparent encapsulant 106 and through the first optical lens 114. After leaving first optical lens 114, ray 116 is reflected off object 120 through optical lens 112 and the second encapsulant 104 into photodiode 108.

The photodiode 108 converts electromagnetic radiation that strikes it into current. This current may be detected. The amount of current detected is proportional to the amount of electromagnetic radiation striking photodiode 108. The amount of current detected may be used to determine a distance d1 between the object 120 and the proximity sensor package 200. In this embodiment, ray 118 travels through the first transparent encapsulant 106. When ray 118 strikes the opaque encapsulant 202, the ray 118 is attenuated. Because the ray 118 is attenuated by the opaque encapsulant 202, cross-talk is reduced. Reducing cross-talk allows the infrared proximity sensor package 200 to operate more accurately.

Figure 3:
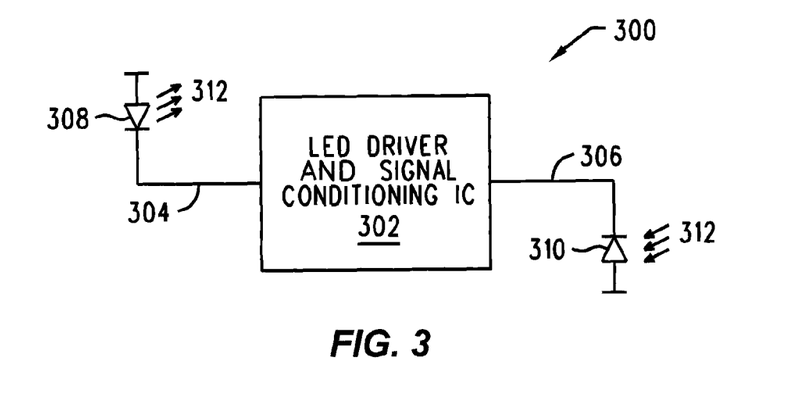
FIG. 3 is a schematic drawing of an embodiment of a proximity sensor with an IC (integrated circuit).

FIG. 3 is a schematic drawing of an embodiment of a proximity sensor 300 with an IC (integrated circuit) 302. In this embodiment, the LED 308 is connected to the IC 302 at node 304. In this embodiment, the photodiode 310 is connected to the IC 302 at node 306. Electromagnetic radiation 312 from the LED 308 is reflected from an object (not shown) into the photodiode 310. In this embodiment, the IC 302 includes the function of a transmitter driver and a signal conditioner. However, other electronic functions may be included such as amplification of a signal, sunlight and ambient light immunity, and transmitter-stuck-high protection.

Figure 4A:
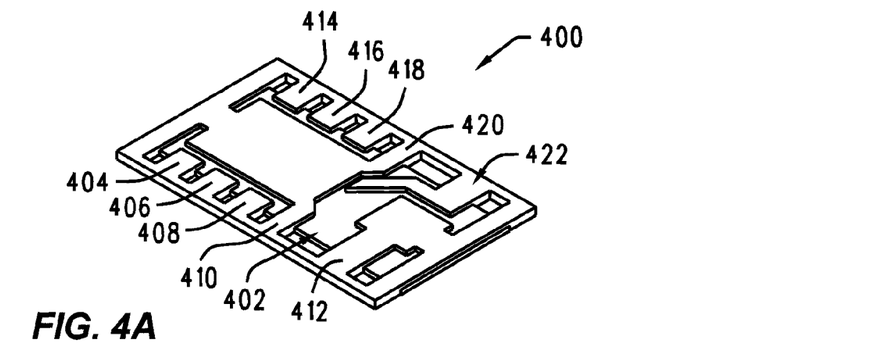
FIG. 4A is an isometric view of a lead frame with a first material adhered to the bottom of the lead frame in accordance with an exemplary is embodiment of the invention.

FIG. 4A is an isometric view of a lead frame 400 with a first material 402 adhered to the bottom of the lead frame 400 in accordance with an exemplary embodiment of the invention. In this embodiment, a first material 402 is attached to the bottom of the lead frame 400. In this example, the first material is kapton tape. However, other materials may be used. In this embodiment, the lead frame 400 is a quad flat pack no-lead (QFN) lead frame. The lead frame 400 includes bonding pads 404-422. As will be explained later, wire bonds may be attached to bonding pads 404-422.

Figure 4B:
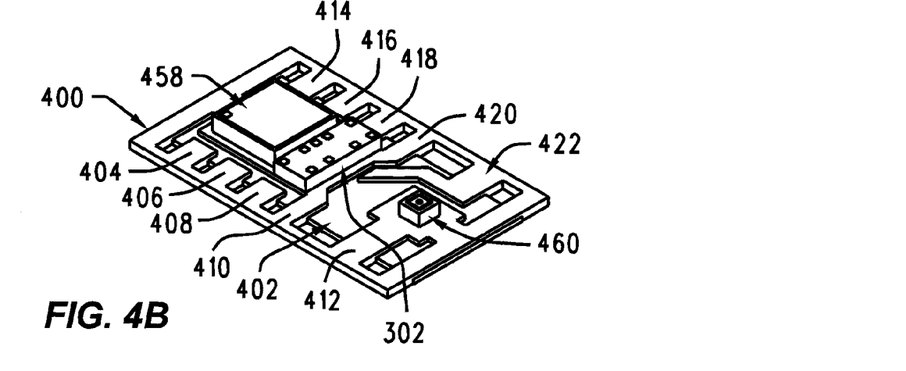
FIG. 4B is an isometric view of a lead frame with a first material adhered to the bottom of the lead frame and an infrared LED, an infrared photodiode, and an IC attached to the top of the lead frame in accordance with an exemplary embodiment of the invention.

FIG. 4B is an isometric view of a lead frame 400 with a first material 402 adhered to the bottom of the lead frame 400 and an infrared LED 460, an infrared photodiode 458, and an IC 302 attached to the top of the lead frame 400 in accordance with an exemplary embodiment of the invention. In this example, the infrared LED 460 is attached to a first portion of the top of the lead frame 400. Also, in this example, an ASIC 302 is attached to a second portion of the top of the lead frame 400. Further, in this example, an infrared photodiode 458 is attached to a third portion of the lead frame 400.

Figure 4C:
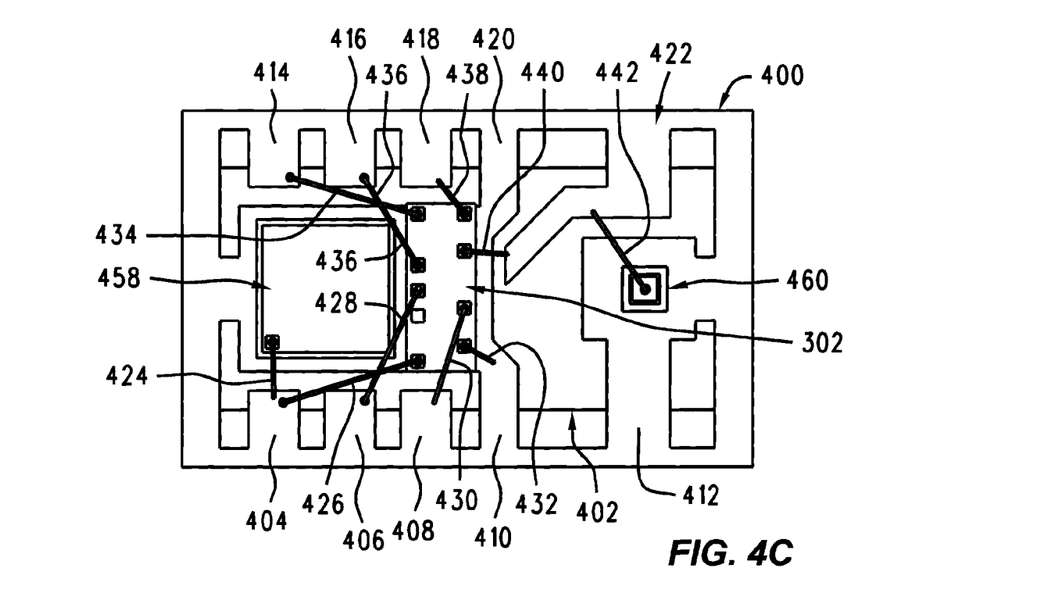
FIG. 4C is a top view of a lead frame with a first material adhered to the bottom of the lead frame and an infrared LED, an infrared photodector, and an IC attached to the top of the lead frame, and wire bonds in accordance with an exemplary embodiment of the invention.

FIG. 4C is a top view of a lead frame 400 with a first material 402 adhered to the bottom of the lead frame 400 and an infrared LED 460, an infrared photodiode 458, and an IC 302 attached to the top of the lead frame 400, and wire bonds 424-422 in accordance with an exemplary embodiment of the invention. The infrared LED 460 used in this example is an LED manufactured by TYNTEK having a model number TK114IRA. The infrared photodiode 458 used in this example is an infrared photodiode manufactured by TYNTEK having a model number TK043PD.

In this example, wire bond 424 is connected to the infrared photodiode 458 and bonding pad 404. Bonding pad 404 provides power for the infrared photodiode 458 and the ASIC 302. Wire bond 426 is connected to the ASIC 302 and bonding pad 404. Wire bond 442 is connected to the infrared LED 460 and bonding pad 422. Bonding pad 422 provides power for the infrared LED 460 and the ASIC 302. The remaining wire bonds and bonding pads are used to connect signals internal to the infrared proximity sensor package and external to the infrared proximity sensor package.

Figure 4D:
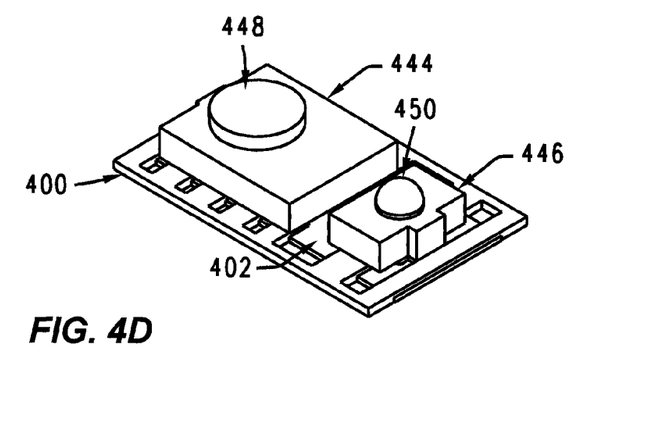
FIG. 4D is an isometric view of a lead frame with a first material adhered to the bottom of the lead frame and an infrared photodector and an IC covered by a first transparent encapsulant and an infrared LED covered by a second transparent encapsulant in accordance with an exemplary embodiment of the invention.

FIG. 4D is an isometric view of a lead frame 400 with a first material 402 adhered to the bottom of the lead frame 400 and an infrared photodiode 458 and an IC 302 covered by a first transparent encapsulant 444 and an infrared LED 460 covered by a second transparent encapsulant 446 in accordance with an exemplary embodiment of the invention. The first transparent encapsulant 444 and the second transparent encapsulant 446, in this example, are transparent to infrared light. A first optical lens 448 is formed using the same transparent compound used to form the first and second transparent encapsulants 444 and 446. A transparent compound, for example, that may be used is manufactured by Nitto Denko having a part number NT8506. However, other transparent compounds may be used such as transparent epoxy resin. The first optical lens 448 is located over an infrared phototdiode 458 (not shown). A second optical lens 450 is formed using the same transparent material used to form the first and second transparent encapsulants 444 and 446. The second optical lens 450 is located over an infrared LED 460 (not shown).

The first transparent encapsulant 444, the second transparent encapsulant 446, the first optical lens 448, and the second optical lens 450 are formed concurrently using a first molding process. For example, the first molding process may use injection molding. However, other molding processes such as transfer molding with pressure may be used. A portion of the lead frame 400 is moldably integrated into the first transparent encapsulant 444. Another portion of the lead frame 400 is moldably integrated into the second transparent encapsulant 446.

Figure 4E:
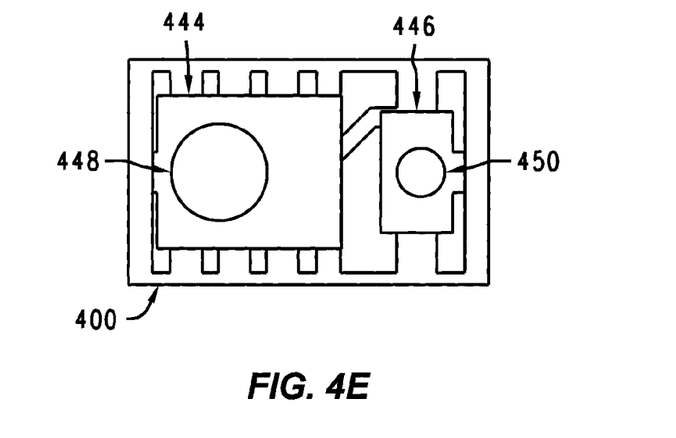
FIG. 4E is a top view of a lead frame with an infrared photodiode and an IC covered by a first transparent encapsulant with a first optical lens and an infrared LED covered by a second transparent encapsulant with a second optical lens in accordance with an exemplary embodiment of the invention.

FIG. 4E is a top view of a lead frame 400 with an infrared photodiode and an IC covered by a first transparent encapsulant 444 with a first optical lens 448 and an infrared LED covered by a second transparent encapsulant 446 with a second optical lens 450 in accordance with an exemplary embodiment of the invention. In FIG. 4E, the first material 402 has been removed from the bottom of the lead frame 400. The first material 402, in this example, is Kapton tape. However, other materials may be used. The first material 402 may be removed using a de-taping machine. However, other methods may also be used to remove the first material.

Figure 4F:
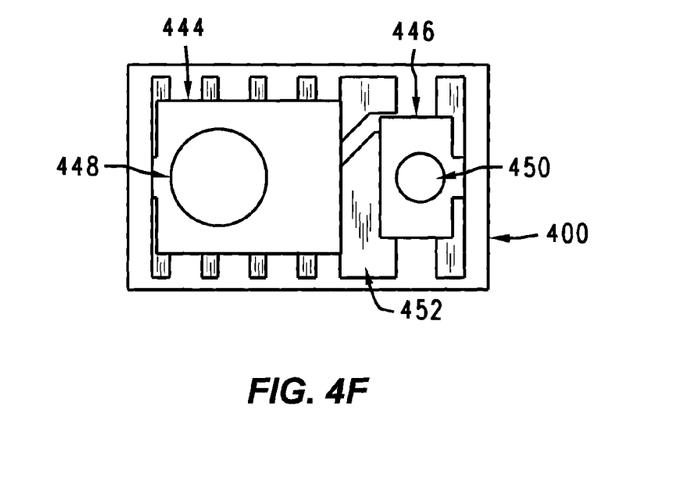
FIG. 4F is a top view of a lead frame with a second material to adhered to a portion of the bottom of the lead frame and an infrared photodector and an IC covered by a first transparent encapsulant and an infrared LED covered by a second transparent encapsulant in accordance with an exemplary embodiment of the invention.

FIG. 4F is a top view of a lead frame 400 with an infrared photodiode and an IC covered by a first transparent encapsulant 444 with a first optical lens 448 and an infrared LED covered by a second transparent encapsulant 446 with a second optical lens 450. In addition, a second material 452 is attached to the bottom of the lead frame 400 in accordance with an exemplary embodiment of the invention. The second material 452 covers approximately the entire bottom portion of the lead frame 400. The second material 452 is applied using a taping machine. However, other methods may be used to apply the second material 452. In this example, the second material 452 is kapton tape. However, other materials may be used.

Figure 4G:
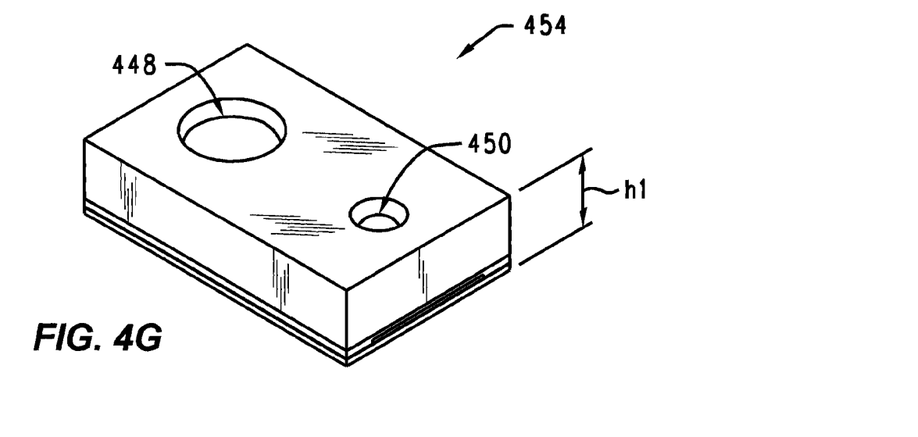
FIG. 4G is an isometric view of an infrared proximity sensor is package in accordance with an exemplary embodiment of the invention.

FIG. 4G is an isometric view of an infrared proximity sensor package 454 in accordance with an exemplary embodiment of the invention. In FIG. 4G, an opaque encapsulant 456 has been formed over the first transparent encapsulant 444, the second transparent encapsulant 446, and portions of the lead frame 400. A portion of the lead frame 400 is moldably integrated into the opaque encapsulant 456. In this example, the top of optical lens 448 and the top of optical lens 450 are not covered by the opaque encapsulant 456. The top of optical lens 450 is not covered by the opaque encapsulant 456 to allow infrared radiation emitted by an LED 460 to be transmitted to a target object. The top of optical lens 448 is not covered by the opaque encapsulant 456 to allow infrared radiation reflected from an object to strike an infrared photodiode 458 shown in FIG. 4I. The apertures, 449 and 451, which expose optical lenses 448 and 450, are formed when the opaque encapsulant is formed.

An opaque compound, for example, that may be used to form the opaque encapsulant 456 is manufactured by Nitto Denko having a part number NT8570. However, other opaque compounds may be used such as black epoxy resin. In this example, the opaque compound attenuates electromagnetic radiation in the frequency range of 700-1200 nanometers (infrared). In this example, transfer molding with pressure is used to form the opaque encapsulant 456. However, other types of molding may be used such as injection molding. After the opaque encapsulant 456 is formed, the second material 452 is removed from the lead frame 400. The second material 452 is usually removed using a de-taping machine. However, other methods may be used to remove the second material 452.

Figure 4H:
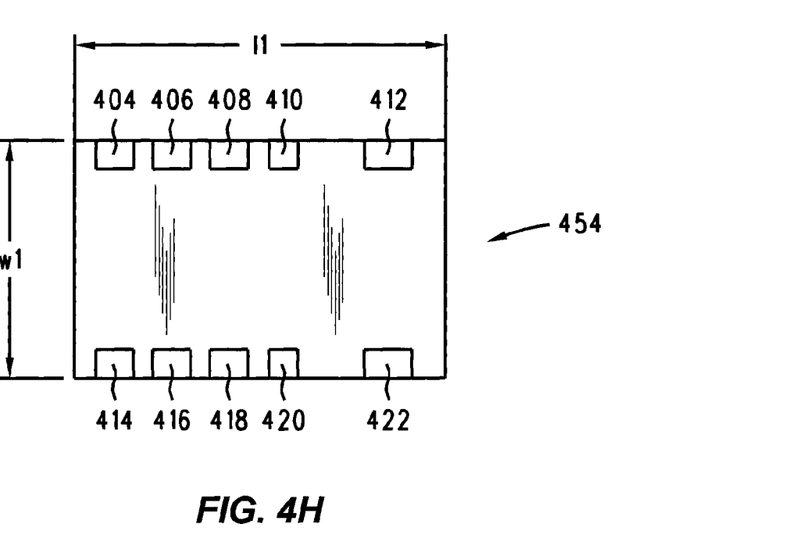
FIG. 4H is a bottom view of an infrared proximity sensor package in accordance with an exemplary embodiment of the invention.

FIG. 4H is a bottom view of an infrared proximity sensor package 454 in accordance with an exemplary embodiment of the invention. In FIG. 4H, bonding pads 404-422 can be seen. Bonding pads 404-422 are used to make electrical connections to various electrical devices. These devices include a personal digital assistant, a mobile phone, a portable device, a handheld device, a personal computer, a notebook computer, a camera, an electronic game, a vending machine, a contactless switch, an industrial machine, and an automated hand dryer.

In an embodiment of the invention, the physical dimensions of an infrared proximity sensor package 454 are h1, l1 and w1 as shown in FIGS. 4G and 4H. In one example of an infrared sensor package 454, the height h1 is not more than 1.0 millimeters, the width w1 is not more than 2.5 millimeters, and the length l1 is not more than 3.9 millimeters. These dimensions make it very convenient to include this infrared proximity package 454 in one of the devices described above.

Figure 4I:
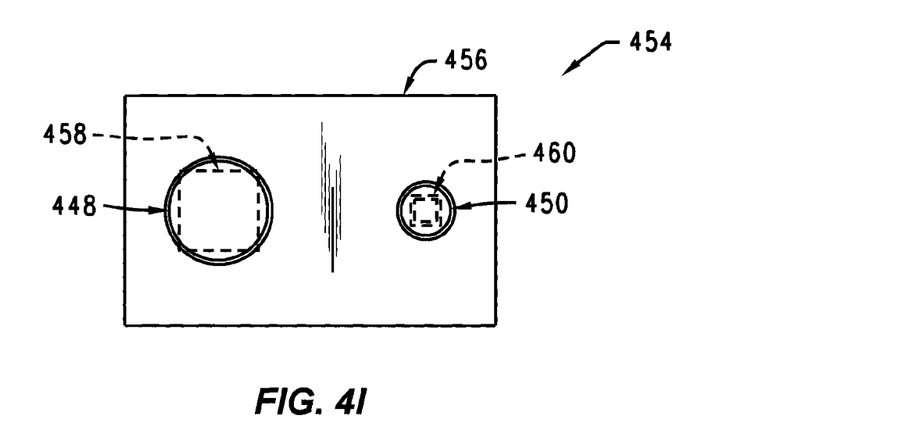
FIG. 4I is a top view of an infrared proximity sensor package in accordance with an exemplary embodiment of the invention.

FIG. 4I is a top view of an infrared proximity sensor package 454 in accordance with an exemplary embodiment of the invention. From the top view shown in FIG. 4I, infrared LED 460 and infrared photodiode 458 are visible. In addition, the first optical lens 448 and the second optical lens 450 are visible.

Figure 5A:
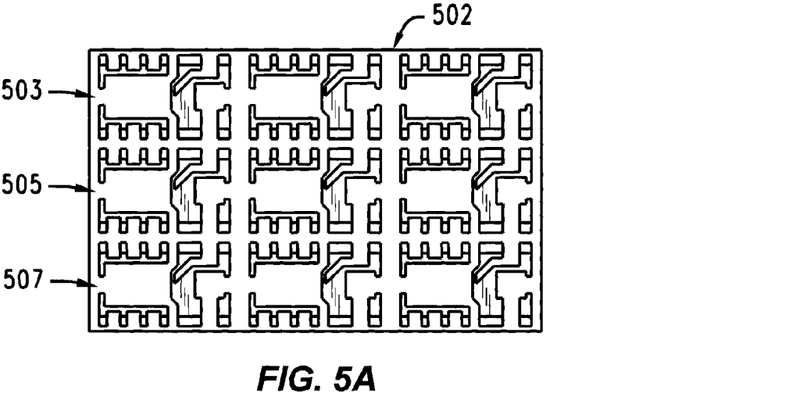
FIG. 5A is a top view of a panel lead frame with first material adhered to the bottom of the panel lead frame in accordance with an exemplary embodiment of the invention.

FIG. 5A is a top view of a panel lead frame 502 with a first material 503, 505 and 507 adhered to the bottom of the panel lead frame 502 in accordance with an exemplary embodiment of the invention. In this example, the panel lead frame 502 contains a 3×3 array of lead frames. In this example, nine infrared proximity packages may be manufactured concurrently using the same process as described in FIGS. 4A-4I. However, smaller or larger panel lead frames may be used.

Figure 5B:
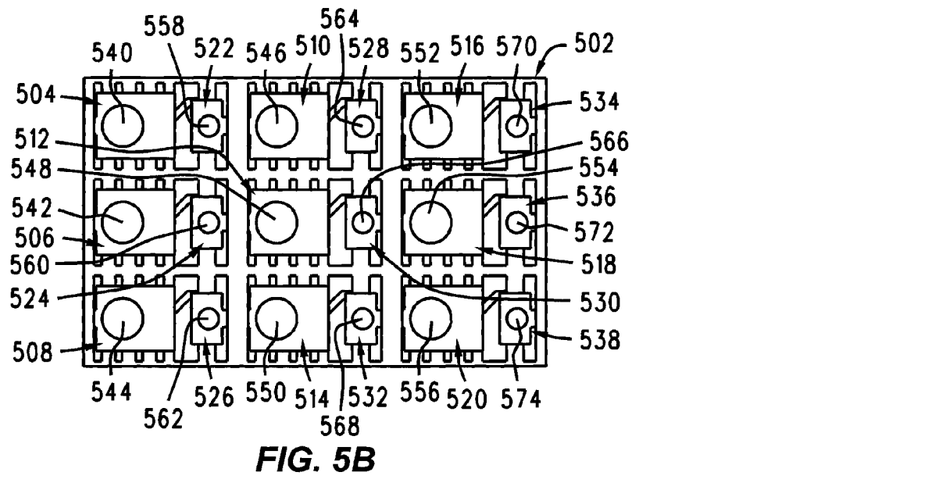
FIG. 5B is a top view of a panel lead frame with infrared photodiodes and ICs covered by a first transparent encapsulant and infrared LEDs covered by a second transparent encapsulant in accordance with an exemplary embodiment of the invention.

FIG. 5B is a top view of the panel lead frame 502 with infrared photodiodes and ICs covered by first transparent encapsulants 504-520 and infrared LEDs covered by second transparent encapsulants 522-538 in accordance with an exemplary embodiment of the invention. In this embodiment, the first material 503, 505 and 507 has been removed. The first transparent encapsulants 504-520, the second transparent encapsulants 522-538, the first optical lenses 540-556, and the second optical lenses 558-574 are formed concurrently using a first molding process. The first molding process may use injection molding. However, other molding processes such as transfer molding with pressure may be used. Portions of the panel lead frame 502 are moldably integrated into the first transparent encapsulants 504-520. Other portions of the panel lead frame 502 are moldably integrated into the second transparent encapsulanst 522-538.

Figure 5C:
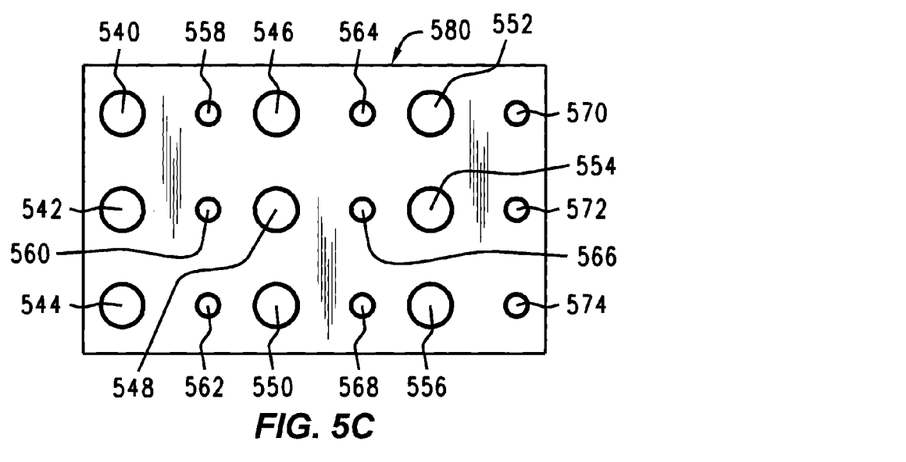
FIG. 5C is a top view of an array of infrared proximity sensor packages in accordance with an exemplary embodiment of the invention.

FIG. 5C is a top view of an array of infrared proximity sensor packages 582 in accordance with an exemplary embodiment of the invention. In FIG. 5C, an opaque encapsulant 580 has been formed over the first transparent encapsulants 504-520, the second transparent encapsulants 522-538, and portions of the panel lead frame 502. Portions of the panel lead frame 502 are moldably integrated into the opaque encapsulant 580. In this example, the top of optical lenses 540-556 and the top of optical lenses 558-574 are not covered by the opaque encapsulant 580. After the opaque encapsulant 580 has been formed and allowed to cure, the array of infrared proximity sensor packages 582 may be separated into individual infrared proximity sensors as shown in FIG. 4G.

Figure 6:
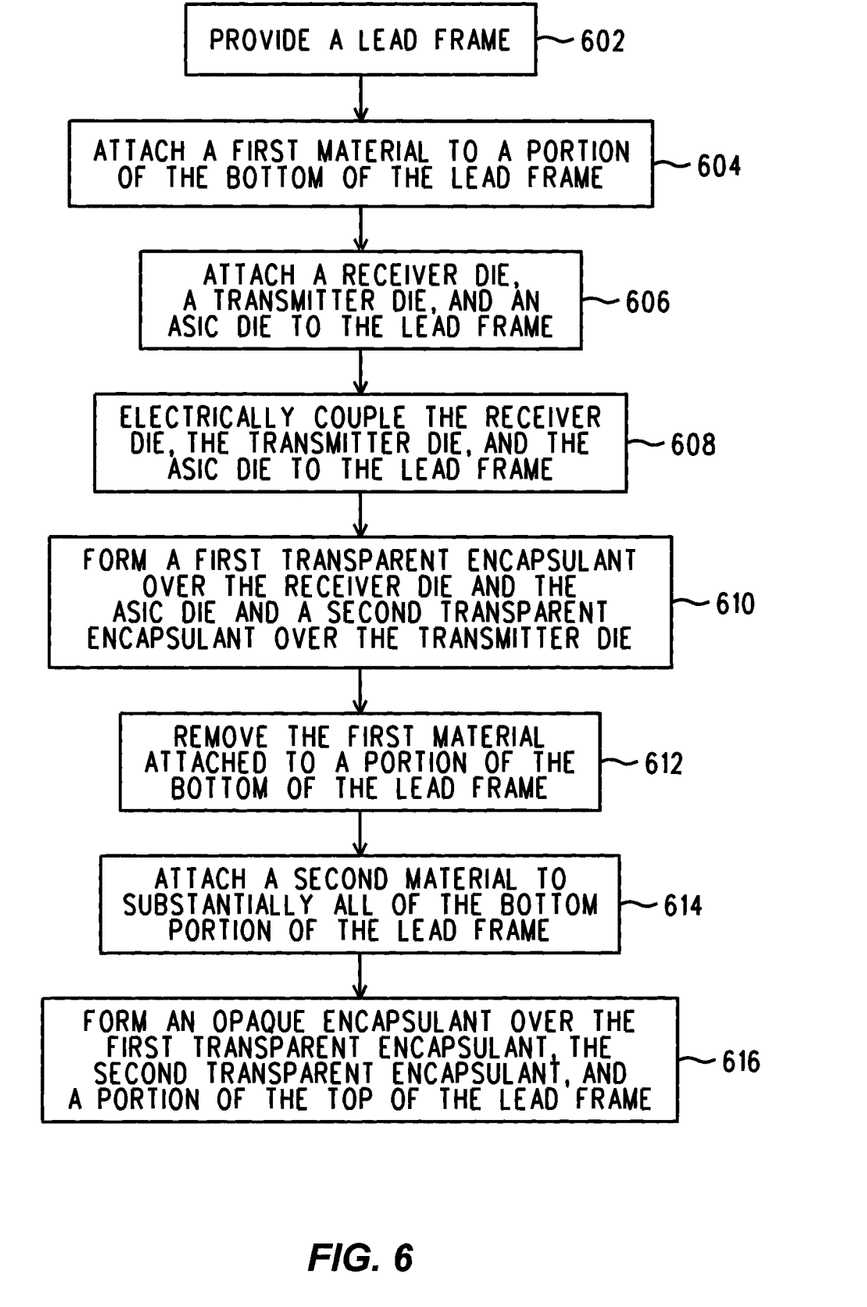
FIG. 6 is a flow chart illustrating an embodiment of a method of making proximity sensor packages.

FIG. 6 is a flow chart illustrating an embodiment of a method of making proximity sensor packages. During step 602, a lead frame is provided. After step 602, a first material is attached to a portion of the bottom of the lead frame, step 604. During step 606, a receiver die, a transmitter die and an ASIC die are attached to the lead frame. After step 606, the receiver die, the transmitter die and the ASIC die are electrically couple to the lead frame, step 608. During step 610, a first transparent encapsulant is formed over the receiver die and the ASIC die and a second transparent encapsulant is formed over the transmitter die.

After step 610, the first material is removed from the back of the lead frame, step 612. After the first material is removed, a second material is attached to substantially the entire bottom portion of the lead frame, step 614. During step 616, an opaque encapsulant is formed over the first transparent encapsulant, the second transparent encapsulant, and a portion of the top of the lead frame.

The foregoing description has been presented for purposes of illustration and description. It is not intended to be exhaustive or to limit the invention to the precise form disclosed, and other modifications and variations may be possible in light of the above teachings. The exemplary embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A method of making a proximity sensor package, comprising:
    providing a lead frame, the lead frame having a top and a bottom portion, wherein a first material is attached to a first portion of the bottom portion of the lead frame;
    attaching a receiver die to a first portion of the top portion of the lead frame;
    attaching a transmitter die to a second portion of the top portion of the lead frame;
    attaching an ASIC die to a third portion of the top portion of the lead frame;
    electrically coupling the receiver die, the transmitter die and the ASIC die to the lead frame;
    concurrently forming a first transparent encapsulant over the receiver die, the ASIC die and a fourth portion of the top portion of the lead frame and a second transparent encapsulant over the transmitter die and a fifth portion of the top portion of the lead frame;
    removing the first material attached to the first portion of the bottom portion of the lead frame;
    attaching a second material to substantially all of the bottom portion of the lead frame;
    forming an opaque encapsulant over a portion of the first transparent encapsulant, a portion of the second transparent encapsulant and a sixth portion of the top portion of the lead frame.

2. The method of claim 1 further comprising forming a first optical lens located over the receiver die currently while forming the first encapsulant.

3. The method of claim 1 further comprising forming a second optical lens located over the transmitter die currently while forming the second encapsulant.

* * * * *